United States Patent [19]
Larson

[11] Patent Number: 6,026,046
[45] Date of Patent: Feb. 15, 2000

[54] APPARATUS FOR DECODING ADDRESSES

[75] Inventor: Douglas Alan Larson, Lakeville, Minn.

[73] Assignee: Micron Electronics, Inc., Nampa, Id.

[21] Appl. No.: 09/111,244

[22] Filed: Jul. 7, 1998

[51] Int. Cl.[7] .................................................. G11C 8/00
[52] U.S. Cl. ................................ 365/230.06; 365/189.07; 365/233
[58] Field of Search ........................ 365/230.06, 189.07, 365/233

[56] References Cited

U.S. PATENT DOCUMENTS

| 5,301,278 | 4/1994 | Bowater et al. ............... 365/233 X |
| 5,860,113 | 1/1999 | Tung .............................. 711/144 |

Primary Examiner—Huan Hoang
Attorney, Agent, or Firm—Dorsey & Whitney LLP

[57] ABSTRACT

A logic device has address decoding logic for receiving an address to be decoded, for performing address decode operations and for providing current address decode operation results, an address range register for storing the address range of a previously decoded address, address comparing logic for comparing the address of the address to be decoded and the address range of the previously decoded address and selecting logic for bypassing a current address decode operation if the address of the address to be decoded is within the address range of the previously decoded address. The device may further have an address decode results register for storing the results of a previous address decode operation, wherein the selecting logic selects the results of the previous address decode operation stored in the address decode results register if the current address decode operation is bypassed.

25 Claims, 5 Drawing Sheets

APPARATUS FOR DECODING ADDRESSES

This application contains subject matter related to an application entitled "A Method for Decoding Addresses" filed on even date herewith, Ser. No. 09/111,243.

FIELD OF THE INVENTION

The present invention relates generally to address decoding. More particularly, the present invention relates to enhancing the speed and efficiency of address decode operations. Specifically, the present invention relates to enhancing the speed and efficiency of address decode operations that consume more than one clock cycle.

BACKGROUND OF THE INVENTION

In a computer system, a device may initiate an address request to, for example, write to or read from an addressable address range of another device. To process these address requests, the computer system has address decoding logic to decode the addresses and determine the destination of the address requests. In a typical computer system, these address decode operations may be performed by comparing the address to be decoded with the addressable address ranges within the computer system. When the address decoding logic determines that the address to be decoded is within a certain address range, the destination specified by the address request and other information relating to the address request is known or may be determined. The destination and other information (hereinafter referred to as the "results of an address decode operation") may be provided to routing logic for routing to the specific address range requested.

In order to minimize the number of "compares" required to decode an address (and, therefore, the number of clock cycles required to decode an address), the address to be decoded may be compared to address ranges that are addressed relatively more frequently before being compared to address ranges that are addressed relatively less frequently. For example, the address to be decoded may be compared to the most frequently addressed address ranges in the computer system during a first clock cycle. If the address to be decoded does not fall within these address ranges, the address to be decoded may be compared to address ranges that are addressed relatively less frequently during a second clock cycle. This comparison process may continue for more than 2 clock cycles until an address range "match" is found.

As computer systems become larger, the efficiency and speed of address decode operations may decrease. In relatively larger computer systems, the number of addressable address ranges may be increased. Accordingly, in relatively larger computer systems, there may be a relatively greater number of "multi-clock addresses" or addresses that cannot be decoded in a single clock cycle. In general, as the number of multi-clock addresses increases, the number of "multi-clock address decode operations" increases. An increase in the number of multi-clock address decode operations decreases a computer system's speed, efficiency and throughput.

Relatively large numbers of multi-clock addresses may be a particular problem during "bursting" operations or operations in which a particular address range is the subject of repeated, uninterrupted address requests from an address request initiating device. If the address range requested in a bursting operation is a multi-clock address, the address decode operation will repeatedly consume 2 or more clock cycles to decode the multi-clock address while the bursting operation is continued.

Thus, there exists a need in the art for apparatus and methods for decreasing the amount of multi-clock address decode operations in a computer system comprising multi-clock addresses.

SUMMARY OF THE INVENTION

One embodiment of the present invention provides a logic device comprising address decoding logic for receiving an address to be decoded, for performing address decode operations and for providing current address decode operation results, an address range register for storing the address range of a previously decoded address, address comparing logic for comparing the address to be decoded and the address range of the previously decoded address and selecting logic for bypassing a current address decode operation if the address to be decoded is within the address range of the previously decoded address.

The device may further comprise an address decode results register for storing the results of a previous address decode operation, wherein the selecting logic selects the results of the previous address decode operation stored in the address decode results register if the current address decode operation is aborted.

DETAILED DESCRIPTION OF THE INVENTION

Figure 1:
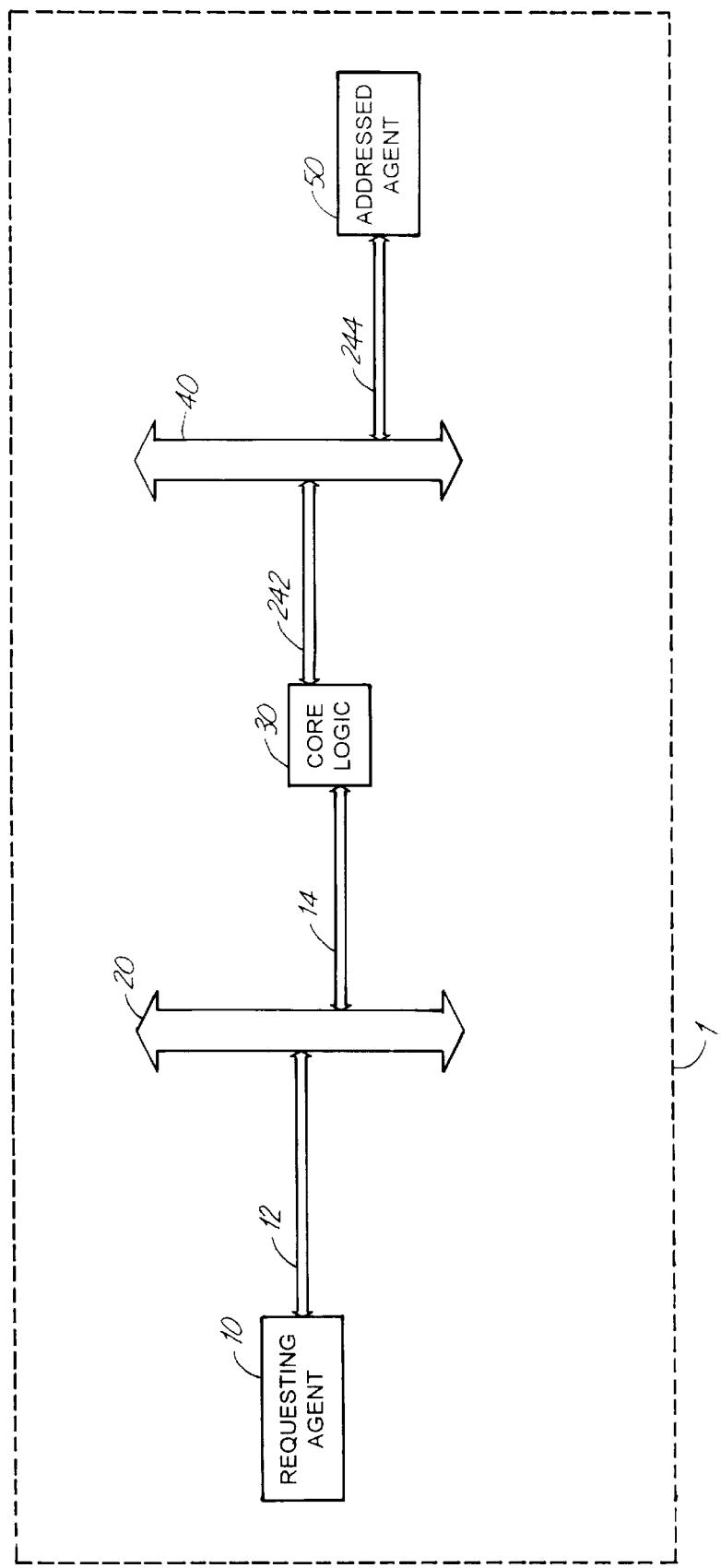
FIG. 1 is a block diagram of a computer system comprising one embodiment of the present invention.

FIG. 1 is a block diagram of a computer system comprising one embodiment of the present invention. In FIG. 1 there are shown portions of a computer system 1 comprising a requesting agent 10 (which may also be referred to as an "initiator"), a first bus 20, core logic 30, a second bus 40 and an addressed agent 50 (which may also be referred to as an "target agent"). The requesting agent 10 (which may be, for example, a processor such as a Intel Pentium Pro processor) is operably connected to the first bus 20 (which may be a Pentium Pro processor bus or "P6" bus) through connection 12. The core logic 30 is also operably connected to the first bus 20 through connection 14. The target agent 50 (which may be, for example, a PCI device or a memory device) is operably connected to the second bus 40 (which may be a PCI bus or a memory bus) through connection 244. The core logic 30 is also operably connected to the second bus 40 through connection 242. As such, the requesting agent 10 may, for example, request to read from an address range of the target agent 50 over the buses 20 and 40 and through the core logic 30.

One Embodiment of the Present Invention

Figure 2:
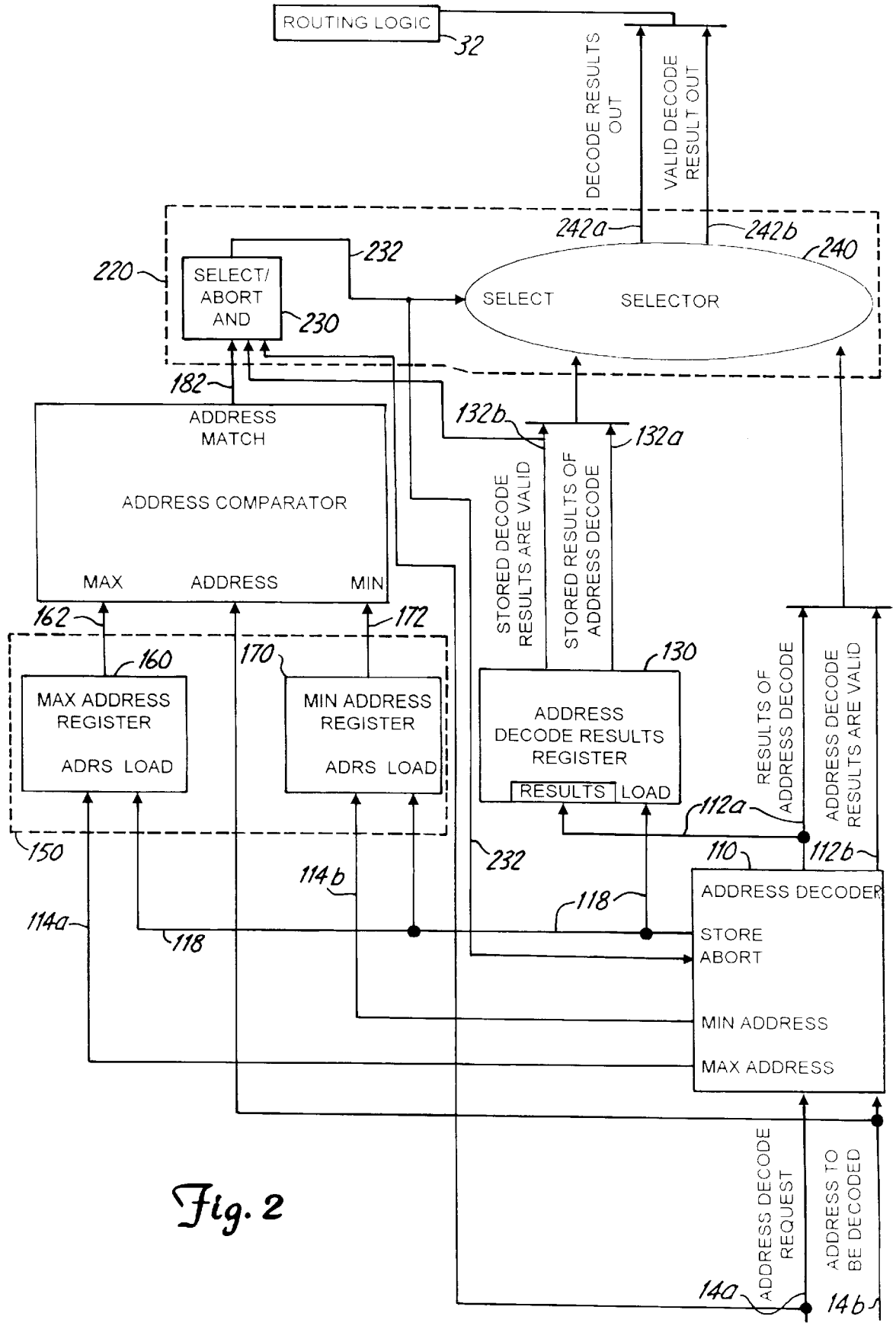
FIG. 2 is a block diagram of some portions of the chipset shown in FIG. 1.

FIG. 2 is a block diagram of some portions of the core logic 30 shown in FIG. 1. The portions of the core logic 30 shown in FIG. 2, including components, functional blocks and signals, may comprise one embodiment of the present invention.

In FIG. 2, there is shown an address decoder 110 which may comprise logic for decoding addresses. The address decoder 110 may receive an address decode request on connection 14*a* and an address to be decoded on connection 14*b*. The address decoder 110 may decode the address to be decoded in response to the address decode request by comparing the address to be decoded with the addressable address ranges of the computer system 1. This decoding process may consume a single clock cycle or may consume more than one clock cycle. The address decoder 110 may provide the results of the address decode operation as an output on connection 112*a*. The address decoder 110 may also provide an address decode results valid signal on connection 112*b* indicating that the results of the current address decode operation are valid.

Hereinafter, an address that is decoded by the address decoder 110 in a single clock cycle may be referred to as a "single clock address." The address decoding operation performed by the address decoder 110 when decoding a single clock address is referred to as a "single clock address decode operation." Similarly, an address that is not decoded by the address decoder 110 within a single clock cycle may be referred to as a "multi-clock address." The address decoding operation performed by the address decoder when decoding a multi-clock address may be referred to as a "multi-clock address decode operation."

Also shown in FIG. 2 is a first storage 130 for storing the results of a previous address decode operation performed by the address decoder 110. The results of the previous address decode operation performed by the address decoder 110 may be provided to the first storage 130 on connection 112*a*. The first storage 130 may store the results of the previous address decode operation when the first storage 130 receives a store signal from the address decoder 110 on connection 118. The first storage 130 may be a register or other conventional computer storage device and may be hereinafter referred to as the "address decode results register" 130. The address decode results register 130 may provide the stored results of the previous address decode operation as an output on connection 132*a*. The address decode results register 130 may also provide a stored address decode results valid signal on connection 132*b* indicating that the stored results of the previous address decode operation are valid.

Also shown in FIG. 2 is a second storage 150 for storing the address range of an address that has been previously decoded by the address decoder 110. The address range of the previously decoded address may be provided to the second storage 150 on connections 114*a* and 114*b*. The second storage 150 may store the address range of the previously decoded address when the second storage 150 receives a store signal from the address decoder 110 on connection 118. The second storage 150 may also be a register or other conventional computer storage device and may be hereinafter referred to as the "address range register" 150. The address range register 150 may be comprised of a maximum address range register 160 for storing the upper address boundary of the range corresponding to the previously decoded address and a minimum address range register 170 for storing the lower address boundary of the range corresponding to the previously decoded address.

As shown in FIG. 2, the upper and lower address boundaries stored in the maximum and a minimum address range registers 160 and 170 may be provided to an address comparator 180 on connections 162 and 172, respectively. The address comparator 180 may also be provided with the current address to be decoded on connection 14*b*. The address comparator 180 may comprise logic for comparing the current address to be decoded and the address range boundaries provided by the maximum and minimum address range registers 160 and 170. If the address comparator 180 determines that the current address to be decoded is within the maximum and minimum address range boundaries, the address comparator 180 may assert or provide an address match signal on connection 182.

As shown in FIG. 2, this embodiment of the present invention may further comprise selection logic 220 which may comprise AND logic 230 and a selector 240. The AND logic 230 may receive the address match signal from the address comparator 180 on connection 182. The AND logic 230 may also receive the address decode request signal on connection 14*a* and the stored decode results valid signal on connection 132*b*. The AND logic 230 may logically AND the address match signal, the address decode request signal and stored decode results valid signal and may assert or provide a select/abort signal as an output on connection 232. A select/abort signal on connection 232 may indicate that the address of the current address to be decoded is within the stored address range of an address that has been previously decoded. If this is true, the desired address decode results for the current address to be decoded will have been previously stored in the address decode results register 130.

The selector 240 may receive the select/abort signal on connection 232. The selector 240 may also receive the results of the current address decode operation performed by the address decoder 110 on connection 112*a* and the results of a previous address decode operation stored in the address decode results register 130 on connection 132*a*. The selector 240 may be configured such that if the selector 240 receives a select/abort signal from the AND logic 230 on connection 232, the selector 240 may provide the results of the previous address decode operation stored in the address decode results register 130 as an output on connection 242*a*. Additionally, in this situation, the select/abort signal may also be provided to the address decoder 110 on connection 232 and may cause the address decoder 110 to abort or terminate the current address decode operation.

Alternatively, if the selector 240 does not receive a select/abort signal (i.e., if at least one of the address match, address decode request or stored decode results valid signals has not been received by the AND logic 230), the selector 240 may be configured such that the selector 240 may provide the results of the current address decode operation as an output on connection 242*a*. In either of the above cases, the selector 240 may also provide a decode results valid signal as an output on connection 242*b*.

An Alternative Embodiment of the Present Invention

Figure 3:
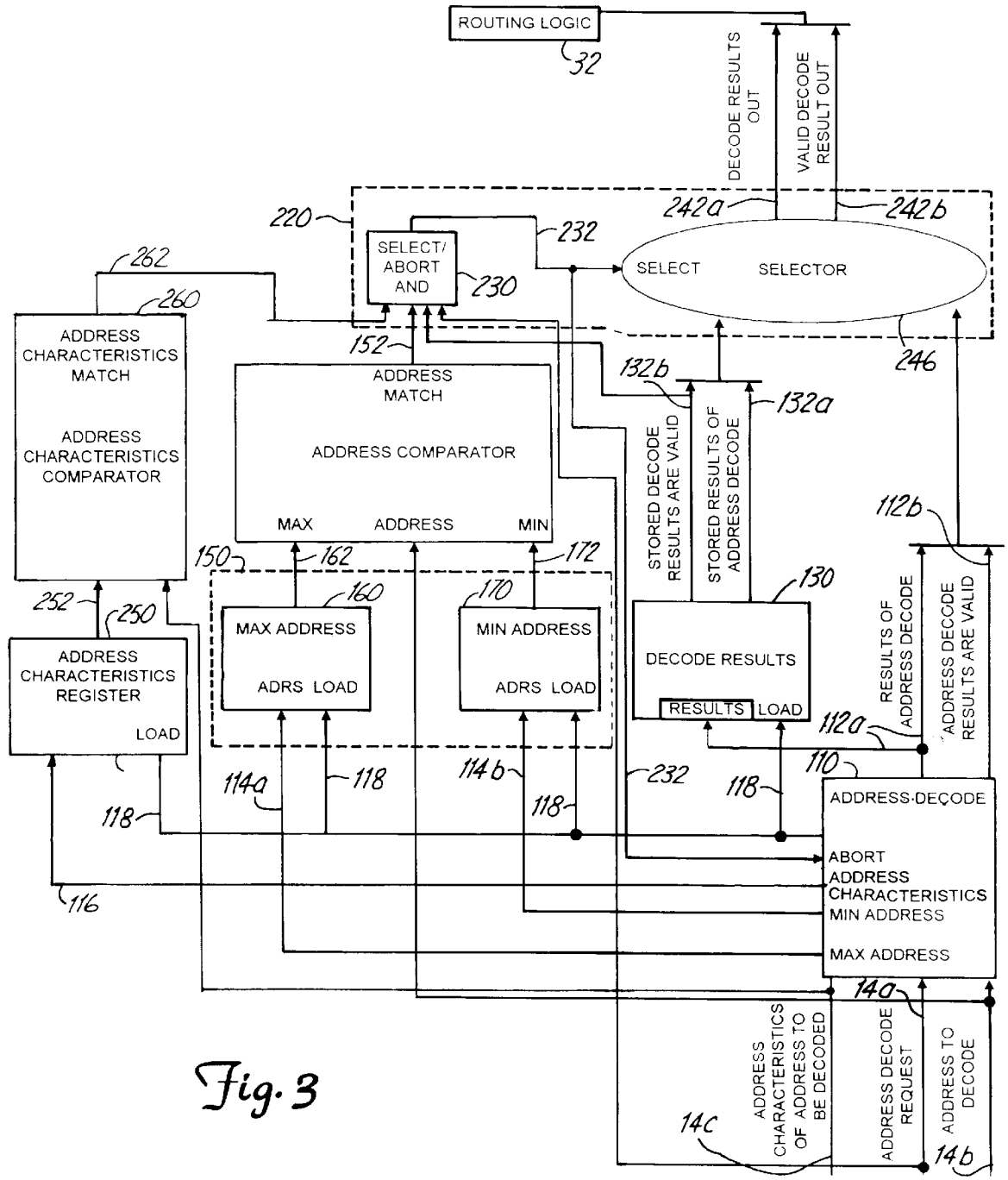
FIG. 3 is a block diagram of some portions of the chipset shown in FIG. 1 and illustrates an alternative embodiment of the present invention.

In an alternative embodiment of the present invention shown in FIG. 3, the address decoder 110 may receive miscellaneous information relating to the address decode request or to the address to be decoded on connection 14*c*. This miscellaneous information may include, without limitation, information relating to the type of address request (e.g., whether the address request is a read or a write request), the length of the address to be decoded or the type of device to which the address request is directed (e.g., whether the address request is directed to a memory device or an I/O device). The miscellaneous information provided to the address decoder 110 on connection 14*c* may be hereinafter referred to as the "address characteristics".

The alternative embodiment of the present invention shown in FIG. 3 may comprise a third storage 250 for storing the address characteristics of an address that has been previously decoded by the address decoder 110. The address characteristics of the address that has been previously decoded by the address decoder 110 may be provided to the third storage 250 on connection 116. The third storage 250 may store the address characteristics of the address that has been decoded by the address decoder 110 when the third storage 250 receives a store signal from the address decoder 110 on connection 118. The third storage 250 may be a register or other conventional computer storage device and may be hereinafter referred to as the "address characteristics register" 250.

As shown in FIG. 3, the address characteristics stored in the address characteristics register 250 may be provided to an address characteristics comparator 260 on connection 252. The address characteristics comparator 260 may also be provided with the address characteristics of the current address to be decoded on connection 14*c*. The address characteristics comparator 260 may comprise logic for comparing the address characteristics of the current address to be decoded and the address characteristics stored in the address characteristics register 250.

The address characteristics comparator 260 may determine whether the address characteristics of the address to be decoded are "characteristically equivalent" to the address characteristics stored in the address characteristics register 250. The address characteristics of two addresses may be characteristically equivalent if, for example, both address requests are read requests and both addresses are within the same I/O device. If the address characteristics comparator 260 determines that the address characteristics are characteristically equivalent, the address characteristics comparator 260 may assert or provide an address characteristics match signal to the AND logic 230 on connection 262. Operation of this embodiment of the present invention may then proceed as described above, with the "characteristically equivalent" requirement now also being a prerequisite for selection of the results of the previous address decode operation shared in the address decoder results register 130.

Operation of the Present Invention

With reference to FIGS. 1–4, the operation of the above embodiments of the present invention will now be described in greater detail. In operation, the present invention may decrease the amount of multi-clock address decode operations in a computer system 1.

Figure 4A:
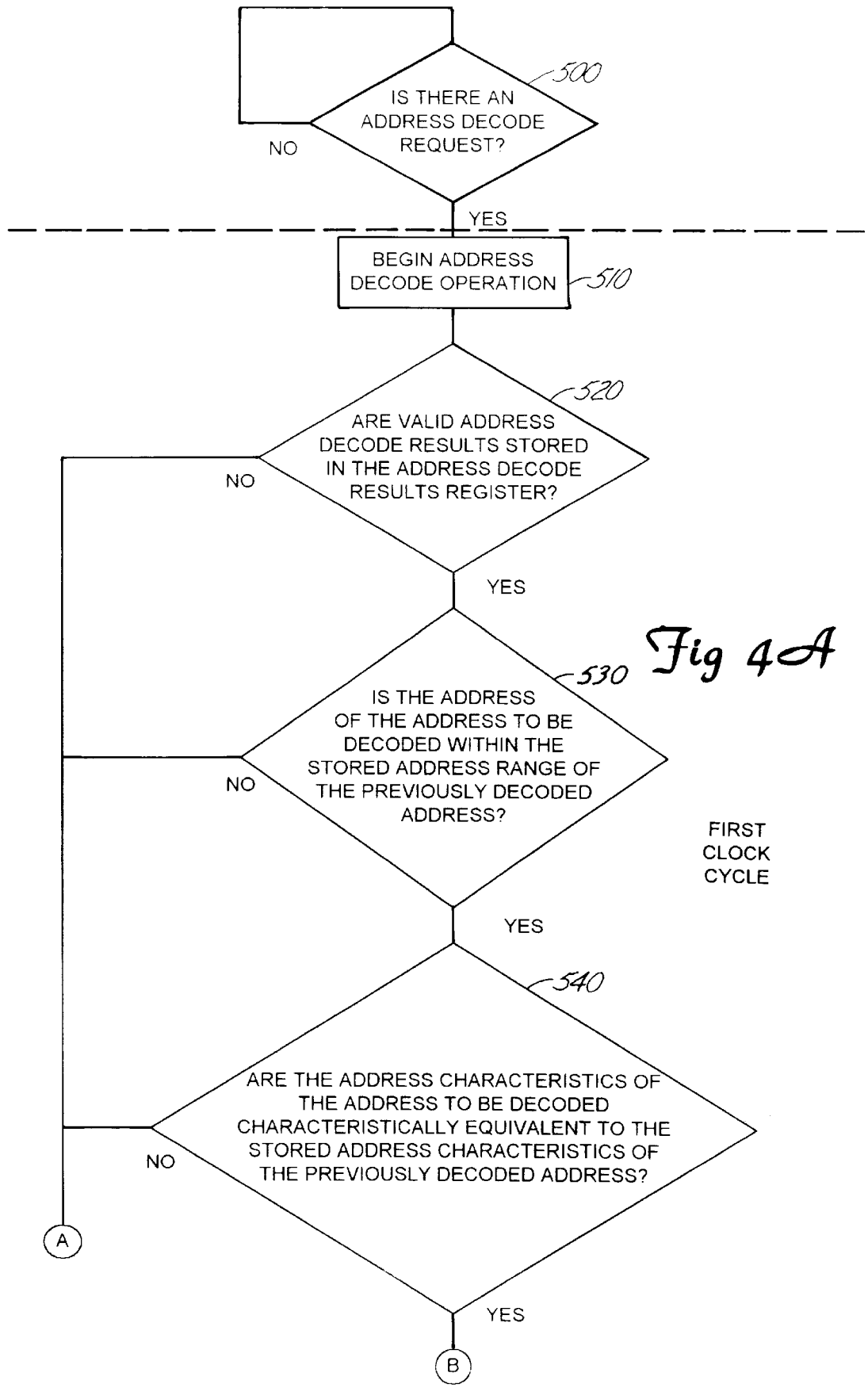
FIGS. 4A and 4B are a flow chart illustrating a process for decoding addresses according to one embodiment of the present invention.
Figure 4B:
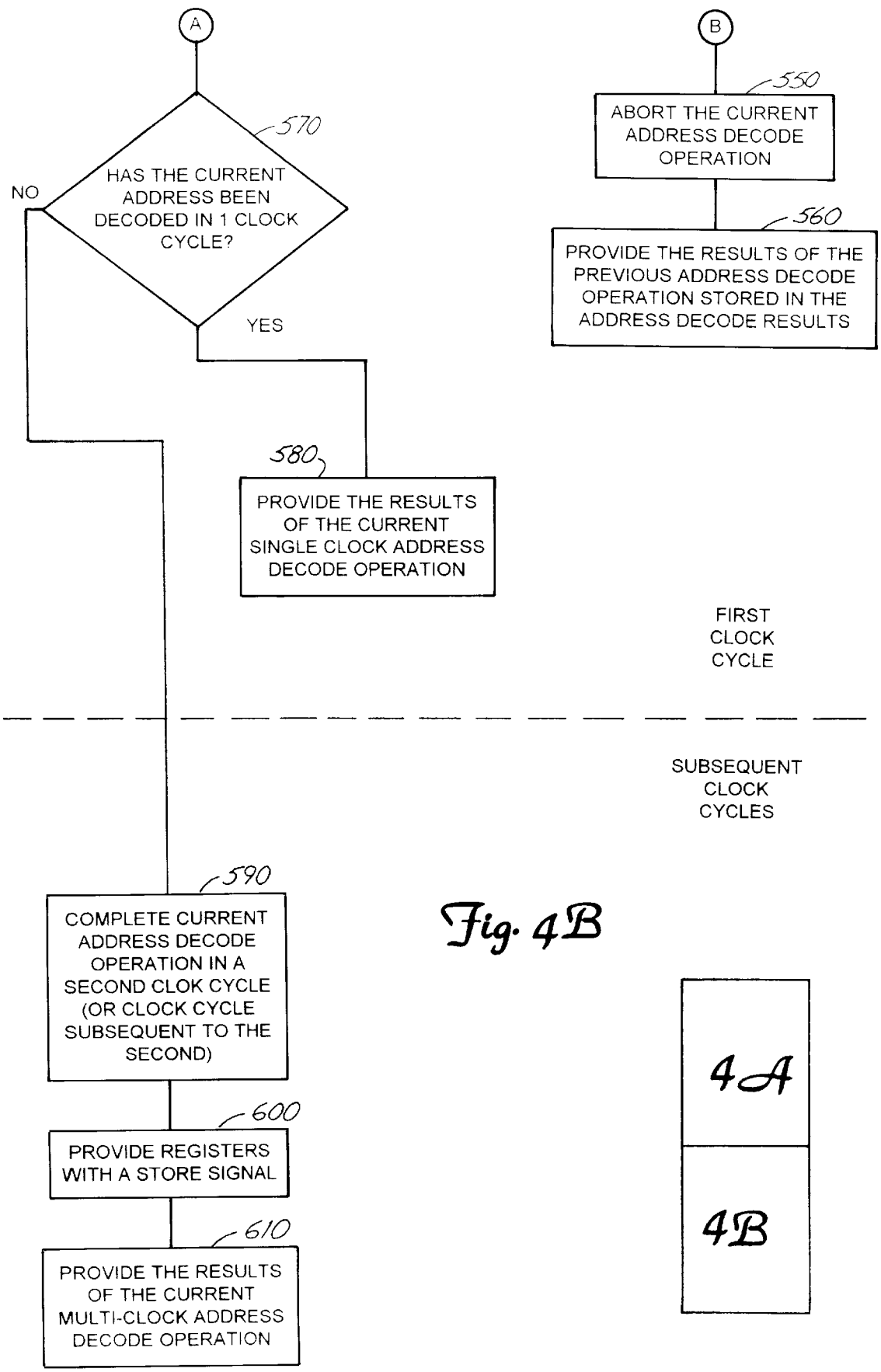

At block 500 of FIG. 4, operation of one embodiment of the present invention may begin when the address decoder 110 receives an address decode request on connection 14*a*. The address decode request may be accompanied by the current address to be decoded on connection 14*b* and, in the alternative embodiment, address characteristics of the current address to be decoded on connection 14*c*. At block 510 of FIG. 4, the address decoder 100 may begin to decode the address to be decoded during a first clock cycle. As shown in blocks 520, 530 and 540, during the first clock cycle, it may also determined (1) whether valid address decode results are stored in the address decode results register (indicated by an address decode results valid signal being provided to the AND logic 230 on connection 132*a*), (2) whether the current address to be decoded is within the stored address range of the previously decoded address (indicated by an address match signal being provided to the AND logic 230 on connection 182) and, in the alternative embodiment, (3) whether the address characteristics of the current address to be decoded are characteristically equivalent to the stored address characteristics of the previously decoded address (as indicated by an address characteristics match signal being provided to the AND logic 230 on connection 262). If all of these conditions have been met, the desired address decode results for the current address decode operation have already been stored in the address decode results register 130. Thus, continuing to block 550, the AND logic 230 may provide the address decoder 110 with an abort signal causing the address decoder 110 to abort the current address decode operation. At block 560, and still within the first clock cycle, the selector 240 may then select the results of the previous address decode operation stored in the address decode results register 130. The selector 240 may then provide these results as an output on connection 242*a*. The results may be provided to routing logic 32 within the core logic 30 for routing to the target agent 50. It may be seen that, in effect, the present invention has "bypassed" the address decoder 110 utilizing bypass logic and has provided the results of, for example, a multi-clock address decode operation in a single clock cycle. In other words, the selection logic 220, address comparator 180, address characteristics comparator 260 and the various related registers described above may comprise bypass logic for bypassing the address decoder 110 when certain multi-clock addresses are presented for decoding.

If, however, one of the conditions of blocks 520, 530 or 540 are not met, operation will proceed to block 570. At block 570, the address decoder 110 will determine whether the current address to be decoded has been decoded in a single clock cycle. If the current address to be decoded has been decoded in a single clock cycle (i.e., the address to be decoded was a single clock address), the address decoder 110 will provide the results of the current single clock address decode operation to the selector 240 at block 580. Because the selector 240 has not received a select signal from the AND logic 230, the selector 240 will select the results of the current address decode from the address decoder 110 and provide these results as an output on connections 242*a*. The results may be provided to routing logic 32 within the core logic 30 for routing to the target agent 50.

Alternatively, at block 570, if the address decoder 110 has not decoded the address to be decoded in a single clock cycle (i.e., the address to be decoded is a multi-clock address), the address decoder 110 may complete the multi-clock address decode operation in a second clock cycle at block 590. (The multi-clock address decode operation may, in fact, require more than two clock cycles). At block 600, when the multi-clock address decode operation has been completed, the address decoder 110 may provide the address decode results register 130, the address range register 150, and the address characteristics register 250 with a store signal on connection 118 instructing the registers to load the results of the multi-clock address decode operation, the address range of the multi-clock address and the address characteristics of the multi-clock address, respectively. Proceeding to block 610, because the selector 240 has not received a select signal from the AND logic 230, the selector 240 will select the results of the current address decode from the address decoder 110 and provide these results as an output on connections 242*a*.

The operation of one embodiment of the present invention may be further described with reference to several operating conditions or situations that may be encountered by the present invention. In particular, an operating situation in which a multi-clock address is decoded in a single clock cycle will now be described. The following description is for illustration purposes only and is not intended in any way to be limiting.

In one situation, a computer system 1 comprising one embodiment of the present invention may be in a start up condition in which power is first provided to the computer system 1. In this start-up condition, the registers of the embodiments of the present invention described above may be empty. Additionally, in this situation, the address decoder 110 may be presented with a multi-clock address to be decoded on connection 14b.

At block 510, the address decoder 110 may begin decoding the multi-clock address during a first clock cycle. At block 520, because the address decode results register 130 is empty, a stored address decode results valid signal is not provided to the AND logic 230 on connection 132b. Thus, operation of one embodiment of the present invention may proceed to block 570. Because the current address to be decoded is a multi-clock address, the address decoder 110 may not have completed the current multi-clock address decode operation during the first clock cycle. At block 590, the address decoder 110 may complete the current multi-clock address decode operation in a second clock cycle (or clock cycle subsequent to the second clock cycle). At block 600, the address decoder 110 may provide a store signal on connection 118 instructing the various registers of the present invention to load the results of the multi-clock address decode operation, the address range of the multi-clock address, and the address characteristics of the multi-clock address. Finally, at block 610, the selector 240 may provide the results of the current multi-clock address decode operation as an output on connection 242a.

In yet another situation, given that a multi-clock address has been previously decoded by the address decoder 110, the address decoder 110 may be presented with yet another multi-clock address to be decoded. Furthermore, the computer system 1 may be operating in burst mode such that the current address request (and perhaps a large number of subsequent address requests) may be directed to the same address range as the previous address request and may have the same address characteristics as the previous address request. At block 510, the address decoder will begin decoding the current multi-clock address. In this situation, the conditions of blocks 520, 530 and 540 have been met and operation will proceed to block 550. At block 550, the current multi-clock address decode operation will be aborted during the first clock cycle by the abort signal provided by the AND logic 230. At block 560, the selector 240 may then, during the first clock cycle, select and present the stored results of the previous address decode operation as an output on connection 242a. This single clock cycle decoding of multi-clock addresses may continue for the entire duration of the bursting operation.

Thus, it may be seen that one benefit provided by one embodiment of the present invention may be the elimination of at least one clock cycle in decoding certain multi-clock addresses. It may also be seen that this benefit of one embodiment of the present invention may be enhanced when a computer system 1 embodying one embodiment of the present invention is operating in burst mode.

From the foregoing description, it will be apparent that modifications can be made to the one embodiment of present invention and method for using same without departing from the teachings of the present invention. For example, the address characteristics comparator 260 may be configured to determine whether the address characteristics of the current address to be decoded meet certain criteria. These "address decode operation criteria" may be unrelated to the address characteristics of a previously decoded address and may be stored in the address characteristics comparator 260. These criteria may include whether the current address decode request is of a certain type or length or any other desired criteria, unrelated to previous address decode operations, by which it may be determined whether the results of the current or previous address decode operation should be presented. Accordingly, the scope of the invention is only limited as necessitated by the accompanying claims.

What is claimed is:

1. A logic device, comprising:

(a) address decoding logic for receiving a current address to be decoded, for performing current address decode operations and for providing current address decode operation results;

(b) an address range register for storing the address range of a previously decoded address;

(c) address comparing logic for comparing the current address to be decoded and the address range of the previously decoded address; and (d) selecting logic for aborting a current address decode operation if the current address to be decoded is within the address range of the previously decoded address.

2. The device of claim 1, wherein the address range register comprises:

(a) a upper range register for storing the upper address boundary of the range of the previously decoded address; and (b) a lower range register for storing the lower address boundary of the range of the previously decoded address.

3. The device of claim 1, further comprising:

(a) an address characteristics register for storing the address characteristics of a previously decoded address; and (b) address characteristics comparing logic for comparing the characteristics of the current address to be decoded and the characteristics of the previously decoded address;

wherein the selecting logic aborts the current address decode operation if the address characteristics of the current address to be decoded and the address characteristics of the previously decoded address are characteristically equivalent and the current address to be decoded is within the address range of the previously decoded address.

4. The device of claim 3, wherein the address characteristics comparing logic is for comparing the characteristics of the current address to be decoded and address decode operation criteria and wherein the selecting logic aborts the current address decode operation if the characteristics of the current address to be decoded do not meet the address decode operation criteria, the characteristics of the current address to be decoded and the characteristics of the previously decoded address are characteristically equivalent, and the current address to be decoded is within the address range of the previously decoded address.

5. The device of claim 1, further comprising:

an address decode results register for storing the results of a previous address decode operation;

wherein the selecting logic selects the results of the previous address decode operation stored in the address decode results register if the current address decode operation is aborted.

6. The device of claim 5, wherein previous and current address decode operation results comprise target device destination information.

7. The device of claim 5 wherein the results of a current address decode operation are stored in the address decode results register if the current address decode operation is not aborted and the current address decode operation is a multi-clock address decode operation.

8. The device of claim 5, wherein the selecting logic selects the results of the current address decode operation if the current address decode operation has not been aborted.

9. The device of claim 8, wherein the selecting logic selects the results of the previous address decode operation in one clock cycle.

10. A chipset for receiving a current address to be decoded and for providing the results of a current address decode operation, comprising:
   (a) first logic for decoding the current address to be decoded;
   (b) second logic for determining whether the current address to be decoded is within the address range of an address decoded in a previous address decode operation; and
   (c) third logic for providing the results of the previous address decode operation and for aborting the current address decode operation performed in the first logic if the current address to be decoded is within the address range of the address decoded in the previous address decode operation.

11. The chipset of claim 10, further comprising:
   fourth logic for determining whether the characteristics of the current address to be decoded are characteristically equivalent to the characteristics of the address decoded in the previous address decode operation;
   wherein the third logic outputs the results of the previous address decode operation if the characteristics of the current address to be decoded are characteristically equivalent to the characteristics of the address decoded in the previous address decode operation and current address to be decoded is within the address range of the address decoded in the previous address decode operation.

12. The chipset of claim 10, wherein the third logic provides the results of the current address decode operation if the current address decode operation is not aborted by the third logic.

13. The chipset of claim 12, further comprising:
   (a) a first storage for storing the results of the previous address decode operation; and
   (b) a second storage for storing the address range of the address decoded in the previous address decode operation.

14. The chipset of claim 13, wherein the address range of the current address to be decoded is stored in the first storage and the results of the current address decode operation are stored in the second storage if the current address decode is not aborted and the current address to be decoded is decoded in more than one clock cycle.

15. A computer, comprising:
   (a) a requesting agent; and
   (b) core logic comprising:
      (1) decoding logic for receiving a current address from the requesting agent and for decoding the current address; and
      (2) bypass logic for providing the results of a previous address decode operation and for aborting the current address decode operation if the current address received from the requesting agent is within the address range of a previously decoded address.

16. The computer of claim 15 further comprising:
   (a) a target agent; and
   (b) routing logic;
   wherein the core logic provides the results of an address decode operation to the routing logic if the requesting agent addresses the target agent.

17. The computer of claim 15 wherein the previously decoded address is a multi-clock address.

18. The computer of claim 17 wherein the bypass logic comprises storage for storing the results of the previous address decode operation.

19. The computer of claim 17 wherein the bypass logic comprises logic for comparing the current address received from the requesting agent to the address range of the address previously decoded.

20. The computer of claim 19 herein the bypass logic further comprises logic for comparing the characteristics of the current address received from the requesting agent to the characteristics of the address previously decoded and wherein the bypass logic is for providing the results of a previous address decode operation if the current address received from the requesting agent is within the address range of a previously decoded address and the characteristics of the current address received from the requesting agent are characteristically equivalent to the characteristics of the address previously decoded.

21. A computer, comprising:
   (a) a target agent;
   (b) a requesting agent for presenting a requested address associated with the target agent;
   (c) core logic for decoding the requested address; and
   (d) routing logic for receiving the results of an address decode operation from the core logic and for routing the decoded address request to the target agent;
   wherein the core logic provides the routing logic with the results of a previous address decode operation and aborts the current address decode operation if the current address decode request is a multi-clock address and is within the address range of the address previously decoded.

22. The computer of claim 21 wherein the requesting agent is capable of addressing the target agent in bursting mode.

23. The computer of claim 21 wherein the requesting agent is a processor.

24. The computer of claim 21 wherein the target agent is a memory device.

25. The computer of claim 21 wherein the core logic provides the routing logic with the results of a previous address decode address operation in one clock cycle.

* * * * *